(12) United States Patent
Hsu et al.

(10) Patent No.: US 7,945,889 B2
(45) Date of Patent: May 17, 2011

(54) SYSTEM AND METHOD FOR DESIGNING A VOLTAGE REGULATOR MODULE

(75) Inventors: Shou-Kuo Hsu, Taipei Hsien (TW); Ying-Tso Lai, Taipei Hsien (TW); Duen-Yi Ho, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 409 days.

(21) Appl. No.: 12/172,258

(22) Filed: Jul. 13, 2008

(65) Prior Publication Data

US 2009/0076778 A1 Mar. 19, 2009

(30) Foreign Application Priority Data

Sep. 17, 2007 (CN) .......................... 2007 1 0201722

(51) Int. Cl.
*G06F 17/50* (2006.01)
*G06F 9/455* (2006.01)
*G06F 11/22* (2006.01)

(52) U.S. Cl. ........ 716/136; 716/106; 716/111; 716/133; 703/13

(58) Field of Classification Search .................. 716/1, 2, 716/4, 100–101, 106, 110–111, 133, 136; 703/13
See application file for complete search history.

(56) References Cited

U.S. PATENT DOCUMENTS

| 5,548,539 A * | 8/1996 | Vlach et al. ........................ 703/6 |
| 7,356,794 B2 * | 4/2008 | Jiang et al. ........................ 716/6 |
| 7,521,993 B1 * | 4/2009 | O'Neill et al. ................. 327/565 |

* cited by examiner

*Primary Examiner* — Stacy A Whitmore
(74) *Attorney, Agent, or Firm* — Frank R. Niranjan

(57) ABSTRACT

A computer-implemented method for designing a voltage regulator module (VRM) is disclosed. The method includes receiving design parameters and a component data for each component and storing the design parameters and the component data for each component into a component selection table, calculating a work efficiency of the VRM, and storing the work efficiency into a power computation table. The method further includes simulating a derating of each component according to a corresponding rated stress of each component if the work efficiency is greater than or equal to a predetermined work efficiency, calculating a stress ratio of each component, and storing the stress ratio into a component derating table. The component selection table, the power computation table and the component derating table are stored to form a desired VRM model if the stress ratio of each component meets a corresponding derating specification.

16 Claims, 6 Drawing Sheets

| Design Parameters | | |
|---|---|---|
| Vin | 12 V | Input Voltage |
| Vout | 1.8 V | Output Voltage |
| Iout | 32 A | Output Current |
| Istep | 18 A | Maximum Current Step Switching Between Light and Heavy Loading |
| Vdroop_max | 0.09 V | Maximum Output Voltage Droop Specification |
| Fs | 300 kHz | Switching Frequency |
| Nphase | 2 | Number of Phases |
| Input Filter Component Selection | | |
| Cin_Lower | Cin>483uF | Lower Bound of Input Capacitance |
| Cin | 270 uF | Input Bulk Capacitance |
| Ncin | 2 | Number of Input Capacitors |
| ESR_cin | 11 mohm | Equivalent Series Resistance of Input Capacitor |
| Iripple_cin | 7.50 A | Input Current Ripple RMS Value |
| Output Filter Component Selection | | |
| Cout_Lower | Cin>0.7mF | Lower Bound of Output Bulk Capacitance |
| Ncout | 2 | Number of Output Bulk Capacitors |
| Cout | 2200 uF | Output Bulk Capacitance |
| ... | ... | ... |

FIG. 3

| | | Design Parameters | |
|---|---|---|---|
| Vin | 12 | V | Input Voltage |
| Vout | 1.8 | V | Output Voltage |
| Iout | 32 | A | Output Current |
| Fs | | kHz | Switching Frequency |
| ... | | | |
| | | Output Inductor Power Loss | |
| Lout | 0.7 | uH | Output Choke Inductance |
| DCR | 2.2 | mohm | DC Resistance of Output Choke |
| Pcoreloss | 0.6 | W | Inductor Core Loss per Phase |
| Pconduct-ind | 0.8 | W | Inductor Conduction Loss per Phase |
| Pinductor | 1.21 | W | Per Phase Inductor Loss per Phase |
| ... | | | |
| Ptotal | 12.45 | W | Total Power Loss |
| | | Efficiency | |
| E | 82.55 | % | Efficiency |
| E0 | 80 | % | Predetermined Efficiency |

FIG. 4

| Stress | Component Description ||| Component Specification | Rated Stress | Applied Stress | Stress Ratio | Derating Specification |
|---|---|---|---|---|---|---|---|---|
| | Design Reference | Net Select | Component Data | | | | | |
| 1 | L29 | P_VCC | Output Inductor | $Tcore_{MAX}$ | $Tcore_{HotSpot}$ | $Tcore_{HotSpot}$ | $Tcore_{HotSpot}$ | T0 |

SYSTEM AND METHOD FOR DESIGNING A VOLTAGE REGULATOR MODULE

BACKGROUND

1. Field of the Invention

Embodiments of the present disclosure relate to power supplies in electronic systems, and more particularly to systems and methods for designing a voltage regulator module.

2. Description of Related Art

Over the last few years, power supply designers have faced increasing pressure to decrease the cost and also to increase the flexibility, performance, and reliability of power supplies. Furthermore, the power supply designers are faced with time-to-market pressures and an overabundance of choices when designing a power supply for an electronic device.

In order to design a power supply for an electronic device, a power supply designer needs to select a plurality of components for the power supply, and manually calculate a power loss for each of the selected components. This manual design method may lead to many errors. More importantly, if multiple components are used for the power supply, the manual design method becomes inefficient and costly, and may not provide reliable results because of the many errors.

What is needed is a system and method for designing a voltage regulator module in order to reduce errors in component selections of the voltage regulator module and also to improve a reliability of a power supply that is coupled with the voltage regulator module.

SUMMARY

A computer-implemented method for designing a voltage regulator module (VRM) is provided. The VRM includes a plurality of components. The method includes: receiving a plurality of design parameters and a component data for each of the components comprising the VRM, and storing the design parameters and the component data for each of the components into a component selection table; calculating a work efficiency of the VRM based on the design parameters and the component data for each of the components, and storing the work efficiency into a power computation table; simulating a derating of each of the components in the component selection table according to a corresponding rated stress of each of the components in the component selection table upon the condition that the work efficiency is greater than or equal to a predetermined work efficiency; calculating a stress ratio for each of the components in the component selection table, and storing the stress ratio of each of the components into a component derating table; and storing the component selection table, the power computation table, and the component derating table to form a desired VRM model if the stress ratio of each of the components in the component selection table meets a corresponding derating specification for each of the components in the component selection table.

Other advantages and novel features will become more apparent from the following detailed description certain embodiments of the present disclosure when taken in conjunction with the accompanying drawings, in which:

BRIEF DESCRIPTION OF THE DRAWINGS

FIG. 3 is a schematic diagram illustrating one embodiment of part of a component selection table;

FIG. 4 is a schematic diagram illustrating one embodiment of part of a power computation table;

FIG. 5 is a schematic diagram illustrating one embodiment of part of a component derating table.

DETAILED DESCRIPTION OF CERTAIN INVENTIVE EMBODIMENTS

All of the processes described below may be embodied in, and fully automated via, software code modules executed by one or more general purpose computers or processors. The code modules may be stored in any type of computer-readable medium or other computer storage device. Some or all of the methods may alternatively be embodied in specialized computer hardware.

Figure 1:
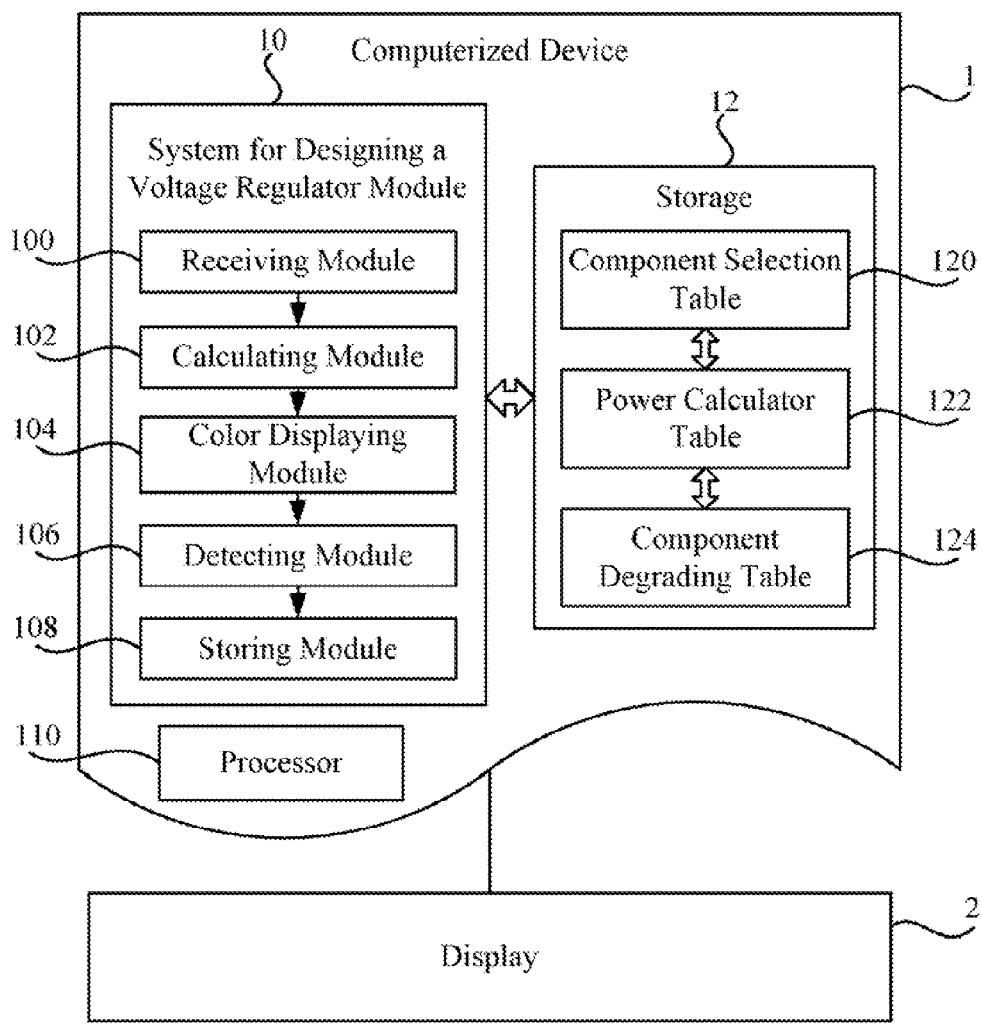
FIG. 1 is a schematic diagram of one embodiment of a system for designing a voltage regulator module.

FIG. 1 is a schematic diagram of one embodiment of a system 10 for designing a voltage regulator module (VRM). The system 10 includes a plurality of software function modules which may be used to implement certain functions and will be described in greater detail below. In one embodiment, the system 10 may include a receiving module 100, a calculating module 102, a color displaying module 104, a detecting module 106, and a storing module 108. The various modules 100, 102, 104, 106, 108 of the system 10 may be executed by a processor 110. Accordingly, the system 10 may be run on a computerized device 1, such as a personal computer, an application server, or a client computer, for example.

In the embodiment of FIG. 1, the computerized device 1 may include a storage 12 for storing data files. A display 2 is connected with the computerized device 1, and provides a user interface for designing the VRM, and displaying the data files.

In one embodiment, the data file may be a spreadsheet or a database. The data file includes a component selection table 120, a power computation table 122, and a component derating table 124. In one embodiment, the component selection table 120, the power computation table 122 and the component derating table 124 can be saved in different corresponding data files.

The receiving module 100 is configured for receiving design parameters and component data input in order to design the VRM. The receiving module 100 is further configured for storing the design parameters and the component data in corresponding columns of the above tables 120, 122, 124.

In one embodiment, the design parameters may include an input voltage, an output voltage, an output current for the VRM, for example. The component data may include component names, component parameters, component specifications, and a total count of each component, for example. The component parameters may include component values and a rated stress of each component in the component data. For example, if the component is a capacitor, the component value of the capacitor is a capacitance. The component specifications include, but are not limited to a rated working voltage (not shown in FIG. 5), a rated current (not shown in FIG. 5), and a maximum temperature (not shown in FIG. 5) of each component. Furthermore, if the component is a capacitor, the component specifications further include a minimum capacitance.

The calculating module 102 is configured for calculating a power loss of each component in the component data, calculating an input power and an output power of the VRM.

Furthermore, the calculating module 102 is further configured for calculating a total power loss of the VRM and a work efficiency of the VRM based on the input power and the output power, and detecting whether each component in the component data is acceptable for designing a desired VRM according to the total power loss and the work efficiency of the desired VRM. It may be understood that a work efficiency E of the VRM may be equal to a ratio of the output power to the input power, and the total power loss maybe equal to a difference between the output power and the input power. Thus, the work efficiency E may be substantially equal to the following equation: $E=(a-b)/a*100\%$, where "a" represents a value of the input power, "b" represents a value of the total power loss. In other words, if the total power loss increases, then the work efficiency of the VRM decreases.

The calculating module 102 is further configured for storing the power loss of each component, the total power loss of the VRM, and the work efficiency of the VRM into the power computation table 122.

The detecting module 104 is configured for detecting whether the work efficiency of the VRM meets a predetermined work efficiency requirement of the VRM by comparing the work efficiency with the predetermined work efficiency. In one embodiment, the predetermined work efficiency may be predetermined by a user of the system 10.

If the work efficiency is greater than or equal to the predetermined work efficiency, namely the work efficiency of the VRM meets the predetermined work efficiency requirement of the VRM, the calculating module 102 simulates a derating of each component in the component data according to a rated stress of each component in the component data. In one example, the calculating module 102 lowers a rated electrical capability of each component based on the rated stress, and calculates an applied stress and a stress ratio for each component. In one embodiment, the stress ratio is equal to a ratio of the applied stress to the rated stress for each component in the component data.

The detecting module 106 is further configured for determining whether the derating meets a derating specification by comparing the stress ratio with the derating specification for each component in the component data.

The storing module 108 is configured for storing the component selection table 120, the power computation table 122 and the component derating table 124 in the data file. Information comprising the component selection table 120, the power computation table 122 and the component derating table 124 may be used to form a desired VRM model if the derating meets the derating specification. The storing module 108 is further configured for establishing a storage path to save the data file into the storage 12.

The color displaying module 104 is configured for displaying the design parameters, the component parameters, calculated contents, and the component specifications in different colors onto a visual display. For example, the color displaying module 104 may display the design parameters and the component parameters in a yellow color, display the calculated contents in an orange color, and display the component specifications in a pink color. The calculated contents may include the power loss of each component, the total power loss of the VRM, and the work efficiency of the VRM.

In another example, the colors displayed by the color displaying module 104 may be predetermined by the designer. When any one of the design parameters or the component data are synchronously stored in two or three tables, the color displaying module 104 may display the design parameters and the component parameters in the same colors. For example, if the input voltage of the VRM is stored in both of the component selection table 120 and the power computation table 122, the color displaying module 104 may display the input voltage of the VRM in a blue color that is different from the colors of the design parameters, the component parameters, the calculated contents, and the component specifications.

Figure 2:
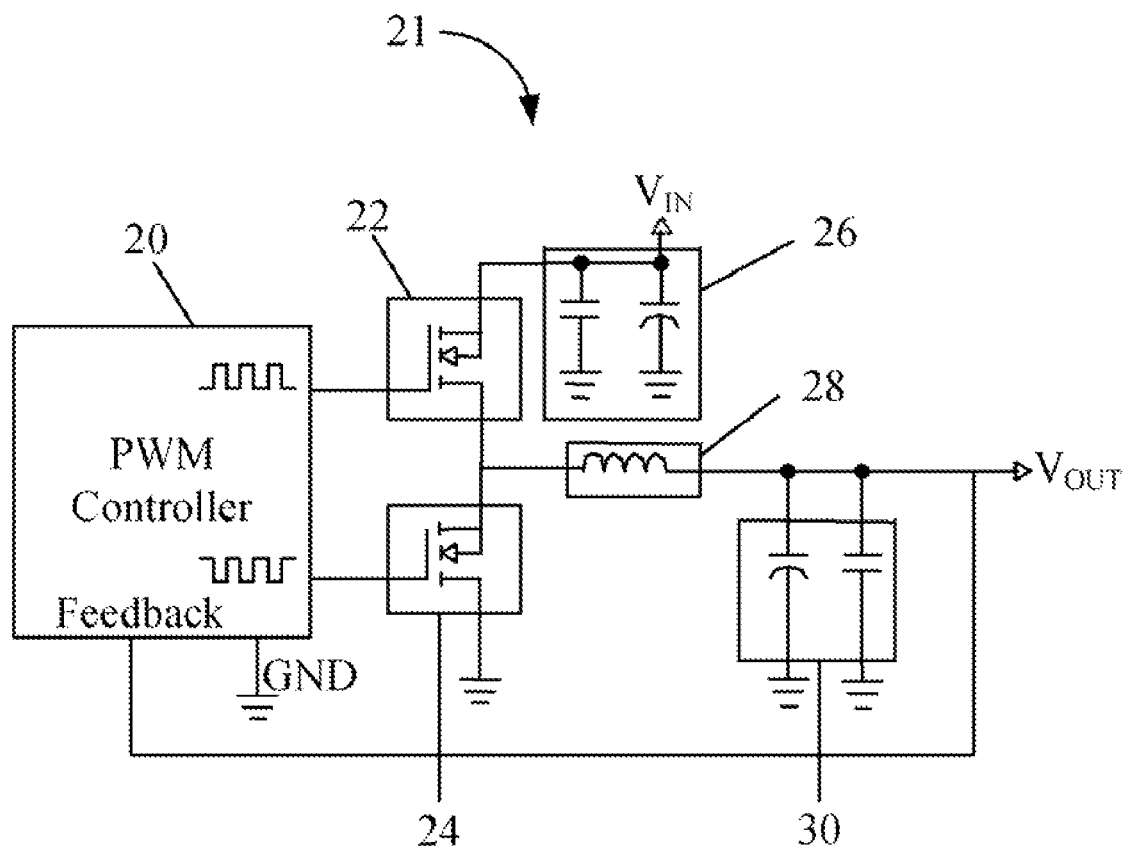
FIG. 2 is a schematic diagram illustrating one embodiment of a direct current switching circuit.

FIG. 2 is a schematic diagram illustrating one embodiment of a direct current (DC) switching circuit 21 used in a VRM. In one exemplary embodiment, an example for designing the DC switching circuit 21 is shown and described below. In one embodiment, the DC switching circuit includes a pulse-width modulation (PWM) controller 20, a high side metal-oxide semiconductor field effect transistor (MOSFET) 22, a low side MOSFET 24, an input capacitor 26, an input resistor 28, and an output capacitor 30. The receiving module 100 receives a plurality of design parameters and a component data for each component 20, 22, 24, 26, 28, 30 of the DC switching circuit 21, and saves the design parameters and the component data in the component selection table 120. FIG. 3 is a schematic diagram illustrating one embodiment of part of the component selection table 120 comprising the design parameters and the component data for the DC switching circuit 21. In the component selection table 120, it only shows the design parameters, the input filter component selection, and the output filter component selection of the DC switching circuit 21.

The calculating module 102 determines a power loss of each component in FIG. 3 and calculates a total power loss and a work efficiency of the DC switching circuit 21. The determination determines whether each component in FIG. 3 is acceptable for designing the DC switching circuit 21. The calculating module 102 is further configured for storing the power loss of each component, the total power loss, and the work efficiency of the DC switching circuit 21 into the power computation table 122. FIG. 4 illustrates one embodiment of part of the power computation table 122 showing the design parameters, an output inductor power loss, the total power loss, the work efficiency and the predetermined efficiency.

In one embodiment, formats of the component selection table 120, the power computation table 122 and the component derating table 124 are not limited to the patterns of FIG. 3, FIG. 4 and FIG. 5.

Figure 6:
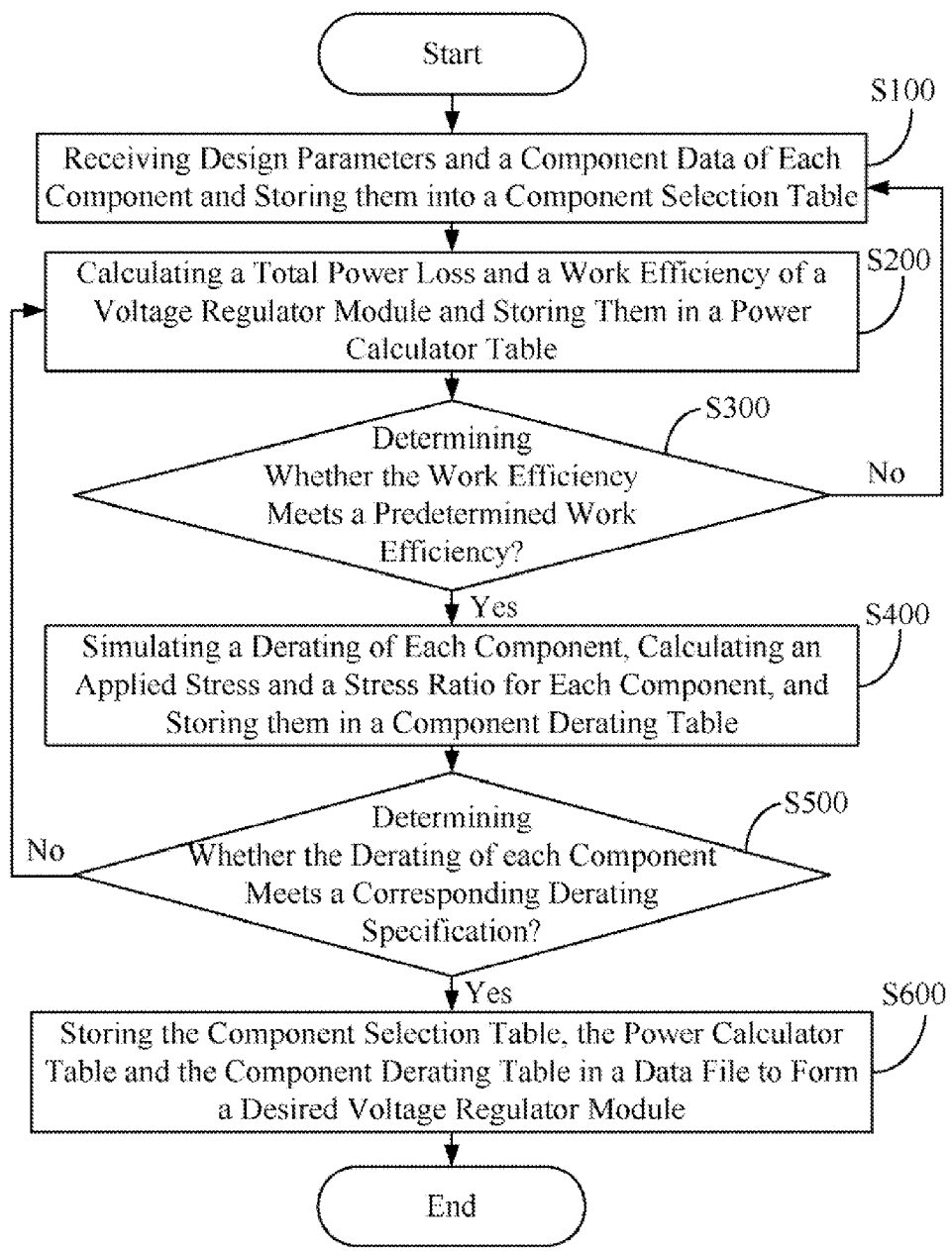
FIG. 6 is a flowchart of one embodiment of a method for designing a voltage regulator module.

FIG. 6 is a flowchart of one embodiment of a method for designing a VRM. Depending on the embodiment, additional blocks may be added, others removed, and the ordering of the blocks may be changed. In block SI00, the receiving module 100 receives information regarding a component data and design parameters for designing the VRM, and stores the component data and the design parameters into corresponding columns of the component selection table 120.

In block S200, the calculating module 102 determines a power loss of each component in the component selection table 120 and determines a total power loss of the VRM and a work efficiency of the VRM. The calculating module 102 is further configured for saving the power loss of each component in the component selection table 120, and the total power loss and the work efficiency of the VRM into the power computation table 122. FIG. 4 illustrates one embodiment of part of the power computation table 122. The power computation table 122 further stores a predetermined efficiency of the VRM that may be predetermined by the power supply designer.

In block S300, the detecting module 104 determines whether the work efficiency of the VRM meets the predetermined efficiency requirement of the VRM by comparing the work efficiency with the predetermined efficiency.

If the work efficiency is less than the predetermined efficiency, the procedure returns to the block S100; Otherwise, if the work efficiency is greater than or equal to the predetermined efficiency, in block S400, the calculating module 102 simulates a derating of each component in the component selection table 120 according to a corresponding rated stress of each component in the component selection table 120. The calculating module 120 further calculates an applied stress and a stress ratio for each component in the component selection table 120, and stores the applied stress and the stress ratio into the component derating table 124. As mentioned above, the stress ratio is equal to a ratio of the applied stress to the rated stress of each component. The component derating table 124 further stores the derating specification that has been predefined by the power supply designer.

In block S500, the detecting module 106 determines whether the derating of each component in the component selection table 120 meets a corresponding derating specification for each component by comparing the stress ratio with the corresponding derating specification for each component.

In one embodiment, if the derating of each component meets the corresponding derating specification for each component, namely the stress ratio is greater than the corresponding derating specification for each component, the procedure returns to the block S200 as described above.

In another embodiment, if the derating of a selected component in the component selection table 120 does not meet the corresponding derating specification of the selected component, namely, the stress ratio of the selected component is less than or equal to the corresponding derating specification of the selected component, in block S600, the storing module 108 stores the table component selection 120, the power computation table 122 and the component derating 124 in the data file to form a desired VRM model, and establishes a storage path to save the data file containing the VRM model into the storage 12.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A computer-implemented method for designing a voltage regulator module (VRM) using a computerized device comprising a storage, the VRM comprising a plurality of components, the method comprising:
   (a) receiving a plurality of design parameters and a component data for each of the components comprising the VRM, and storing the design parameters and the component data for each of the components into a component selection table of the storage;
   (b) calculating a work efficiency of the VRM based on the design parameters and the component data for each of the components, and storing the work efficiency into a power computation table of the storage;
   (c) simulating a derating of each of the components in the component selection table according to a corresponding rated stress of each of the components in the component selection table upon the condition that the work efficiency is greater than or equal to a predetermined work efficiency;
   (d) calculating a stress ratio of each of the components in the component selection table, and storing the stress ratio of each of the components into a component derating table of the storage; and
   (e) storing the component selection table, the power computation table, and the component derating table to form a desired VRM model if the stress ratio of each of the components in the component selection table meets a corresponding derating specification for each of the components in the component selection table; and
   (f) displaying the desired VRM model on a display that is electronically connected to the computerized device.

2. The method as claimed in claim 1, further comprising:
   repeating block (a) to block (c) if the work efficiency is less than the predetermined work efficiency.

3. The method as claimed in claim 1, wherein block (d) comprises:
   determining an applied stress of each of the components in the component selection table, and storing the applied stress for each of the components into the component derating table; and
   determining the stress ratio based on a corresponding rated stress and the applied stress, wherein the stress ratio of each of the components is equal to a ratio of the applied stress to the corresponding rated stress.

4. The method as claimed in claim 1, wherein block (e) comprises:
   repeating block (b) block (e), if the stress ratio of each of the components in the component selection table does not meet the derating specification.

5. The method as claimed in claim 1, wherein the component data comprise a component name, a component parameter, a component specification, and a total count for each component in the component selection table.

6. A system for designing a voltage regulator module (VRM) comprising a plurality of components, the system comprising:
   a receiving module configured for receiving a plurality of design parameters and a component data for each of the components, and storing the design parameters and the component data into a component selection table;
   a calculating module configured for determining a work efficiency of the VRM based on the design parameters and the component data and storing the work efficiency into a power computation table, wherein the calculating module is further configured for calculating a stress ratio of each of the components of the VRM and storing the stress ratio of each of the components into a component derating table;
   a detecting module configured for determining whether the VRM meets a predetermined criteria by detecting whether the work efficiency is greater than or equal to a predetermined efficiency, and whether the stress ratio of each of the components meets a corresponding derating specification;
   a storing module configured for storing the component selection table, the power computation table, and the component derating table to form a desired VRM model if the VRM meets the predetermined criteria; and
   at least one processor that executes the assigning module, the receiving module, the calculating module, and the storing module.

7. The system as claimed in claim 6, wherein the calculating module is further configured for simulating a derating for each of the components upon the condition that the work efficiency is greater than or equal to the predetermined efficiency, and then calculating the stress ratio of each of the components of the VRM.

8. The system as claimed in claim 7, wherein the stress ratio of each of the components equals a ratio of an applied stress to a corresponding rated stress.

9. The system as claimed in claim 6, wherein the calculating module is further configured for determining a power loss of each of the components and a total power loss of the VRM, and storing the power loss and the total power loss in the power computation table.

10. The system as claimed in claim 6, wherein the component data comprise a component name, a component parameter, a component specification, and a total count of each of the components.

11. The system as claimed in claim 6, further comprising a color displaying module configured for displaying the design parameters, the component parameters, calculated contents, and the component specifications in different colors.

12. A non-transitory computer-readable medium having stored thereon instructions for designing a voltage regulator module (VRM), the VRM comprising a plurality of components, the computer-readable medium, when executed by a processor of a computerized device, causing the computerized device to perform a method, the method comprising:
 (a) receiving a plurality of design parameters and a component data for each of the components comprising the VRM, and storing the design parameters and the component data for each of the components into a component selection table of a storage included in the computerized device;
 (b) determining a work efficiency of the VRM based on the design parameters and the component data for each of the components, and storing the work efficiency into a power computation table of the storage;
 (c) simulating a derating of each component in the component selection table according to a corresponding rated stress of each of the components in the component selection table upon the condition that the work efficiency is greater than or equal to a predetermined work efficiency;
 (d) determining a stress ratio of each of the components in the component selection table, and storing the stress ratio of each of the components into a component derating table of the storage; and
 (e) storing the component selection table, the power computation table and the component derating table to form a desired VRM model if the stress ratio of each of the components in the component selection table meets a corresponding derating specification for each of the components in the component selection table; and
 (f) displaying the desired VRM model on a display that is electronically connected to the computerized device.

13. The non-transitory computer-readable medium as claimed in claim 12, wherein the method further comprises:
 repeating block (a) block (c) upon the condition that the work efficiency is less than the predetermined efficiency.

14. The non-transitory computer-readable medium as claimed in claim 12, wherein block (d) comprises:
 determining an applied stress of each of the components in the component selection table, and storing the applied stress for each of the components into the component derating table; and
 determining the stress ratio based on a corresponding rated stress and the applied stress, wherein the stress ratio of each of the components is equal to a ratio of the applied stress to the corresponding rated stress.

15. The non-transitory computer-readable medium as claimed in claim 12, wherein block (e) comprises:
 repeating block (b) block (e) upon the condition that the stress ratio of each of the components does not meet the derating specification.

16. The non-transitory computer-readable medium as claimed in claim 12, wherein the component data comprise a component name, a component parameter, a component specification, and a total count of each of the components in the component data.

* * * * *